United States Patent
Krug, Jr. et al.

(10) Patent No.: US 9,423,061 B2
(45) Date of Patent: *Aug. 23, 2016

(54) LOCKING QUICK CONNECT SPRAY SHIELD WITH VISUAL INDICATOR

(71) Applicant: International Business Machines Corporation, Armonk, NY (US)

(72) Inventors: Francis R. Krug, Jr., Highland, NY (US); Robert K. Mullady, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/054,429

(22) Filed: Feb. 26, 2016

(65) Prior Publication Data

US 2016/0208968 A1    Jul. 21, 2016

Related U.S. Application Data

(63) Continuation of application No. 14/599,583, filed on Jan. 19, 2015.

(51) Int. Cl.
*F16L 37/23* (2006.01)
*F16L 35/00* (2006.01)
*H05K 7/20* (2006.01)

(52) U.S. Cl.
CPC .............. *F16L 35/005* (2013.01); *F16L 35/00* (2013.01); *F16L 37/23* (2013.01); *F16L 2201/10* (2013.01); *H05K 7/20218* (2013.01)

(58) Field of Classification Search
CPC ....... F16L 37/10; F16L 2201/10; F16L 35/00; F16L 35/005; F16L 37/23; F16L 37/138; F16L 2201/30

USPC ................................ 285/13, 371, 84, 85, 86
See application file for complete search history.

(56) References Cited

U.S. PATENT DOCUMENTS

| | | | |
|---|---|---|---|
| 3,191,972 A | 6/1965 | Collar | |
| 4,696,497 A | 9/1987 | Schwarzensteiner | |
| 5,184,851 A | 2/1993 | Sparling et al. | |
| 6,113,151 A | 9/2000 | Beans | |
| 6,786,426 B1 | 9/2004 | Trapp | |
| 7,506,898 B1 * | 3/2009 | Gange | F16L 37/00 285/308 |
| 7,766,039 B2 | 8/2010 | Zuck | |

(Continued)

OTHER PUBLICATIONS

U.S. Appl. No. 14/599,583, filed Jan. 19, 2015; Entitled "Locking Quick Connect Spray Shield With Visual Indicator".

(Continued)

*Primary Examiner* — James Hewitt
(74) *Attorney, Agent, or Firm* — Olivia R. Scheuer

(57) ABSTRACT

According to one embodiment of the present disclosure, an apparatus for a quick connect spray shield includes an inner sleeve having a first end, a second end, and a center axis that is parallel to an axis from the first end to the second end, wherein the inner sleeve has an inner surface that is contoured to position the inner sleeve relative to a female quick connect fitting; and an outer sleeve having a first end, a second end, and a center axis that is parallel to the center axis of the inner sleeve, wherein the outer sleeve has an inner surface contoured to position the outer sleeve relative to an actuating collar of the female quick connect fitting, wherein the actuating collar has an engaged position and a disengaged position.

1 Claim, 4 Drawing Sheets

(56) References Cited

U.S. PATENT DOCUMENTS

| | | |
|---|---|---|
| 8,056,581 B2 | 11/2011 | Danielson et al. |
| 2010/0264647 A1* | 10/2010 | Gange .................... F16L 35/00 285/123.3 |
| 2010/0327575 A1 | 12/2010 | Blanchard et al. |
| 2012/0051832 A1 | 3/2012 | Krause et al. |
| 2013/0015654 A1 | 1/2013 | Gilham et al. |
| 2014/0137960 A1 | 5/2014 | Adams et al. |
| 2014/0145430 A1* | 5/2014 | Tiberghien ............. F16L 37/23 285/308 |
| 2014/0335723 A1 | 11/2014 | Anderson et al. |

OTHER PUBLICATIONS

List of IBM Patents or Patent Applications Treated As Related; Dated May 9, 2016; 2 pages.

* cited by examiner

LOCKING QUICK CONNECT SPRAY SHIELD WITH VISUAL INDICATOR

BACKGROUND OF THE INVENTION

The present invention relates generally to the field of computer cooling devices, and more particularly to spray shields for quick connect couplers.

The number of computers, as well as the number of components within the computer, has grown steadily since the early 1990s. Accompanying the growth of computer usage is increased energy usage. Computer cooling devices are one major source of energy usage. As the number of computers and components increase, the need for efficient cooling techniques also increases.

Many cooling techniques have been developed for the use in computers, including fans, liquid coolers, and refrigeration. The use of fans in large scale computer banks has proven inefficient. Further, the use of refrigeration has proven costly. As a result, liquid cooling has become the standard for large scale computing cooling.

Liquid cooling utilizes a series of liquid transmission vessels (e.g., hoses, bladders, heat exchangers, liquid blocks) placed close to the computer components. As liquid flows through the vessels, heat is transferred from the components to the liquid in the vessels. The liquid later runs through a cooler that will absorb the heat before the liquid is recirculated through the vessels. Quick connects are used to join together vessels within the cooling system.

A quick connect is a coupler that allows vessels to be joined and separated with ease. Quick connects are used in the computing cooling system as the fittings can be easily manipulated in the small spaces that often accompany the computing environment.

SUMMARY

According to one embodiment of the present disclosure, an apparatus for a quick connect spray shield includes an inner sleeve having a first end, a second end, and a center axis that is parallel to an axis from the first end to the second end, wherein the inner sleeve has an inner surface that is contoured to position the inner sleeve relative to a female quick connect fitting; and an outer sleeve having a first end, a second end, and a center axis that is parallel to the center axis of the inner sleeve, wherein the outer sleeve has an inner surface contoured to position the outer sleeve relative to an actuating collar of the female quick connect fitting, wherein the actuating collar has an engaged position and a disengaged position.

As disclosed herein, a method for shielding a quick connect, includes receiving a force exerted on an outer sleeve, wherein the force is parallel to a center axis of the outer sleeve, wherein the outer sleeve is disposed around an inner sleeve, selectively interfering, by a lever of the inner sleeve, with movement of the outer sleeve based on whether the lever is in a locked position, wherein the movement is in response to the force exerted on the outer sleeve, and indicating whether the actuating collar is in an engaged position by selectively presenting an indicator of the inner sleeve through a viewing window of the outer sleeve.

DETAILED DESCRIPTION

Quick connect couplings are fittings for vessels within computer cooling systems that are easy to join and separate in tight spaces. However, tight spaces can make it difficult to determine if the couplings are properly connected. Improperly connected couplings can allow fluid to leak out of the vessels and onto the computer hardware. Liquids spilled on or near the computer hardware can cause significant damage. Further, traditional quick connect couplings can be accidentally disconnected, further increasing the chances of fluid leaking onto the computer components.

The disclosed invention provides an apparatus that can be attached to existing quick connect couplings. The apparatus provides a secondary lock on the quick connect coupling to prevent accidental release. Additionally, the maneuverability of the apparatus, while attached to the couplings, provides a highly visible indicator to signify the couplings are securely locked. Yet another function of the apparatus is to control spray of a disconnected coupling that may result when the couplings are not properly sealed during the disconnect.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The present disclosure will now be described in detail with reference to the Figures.

Figure 1:
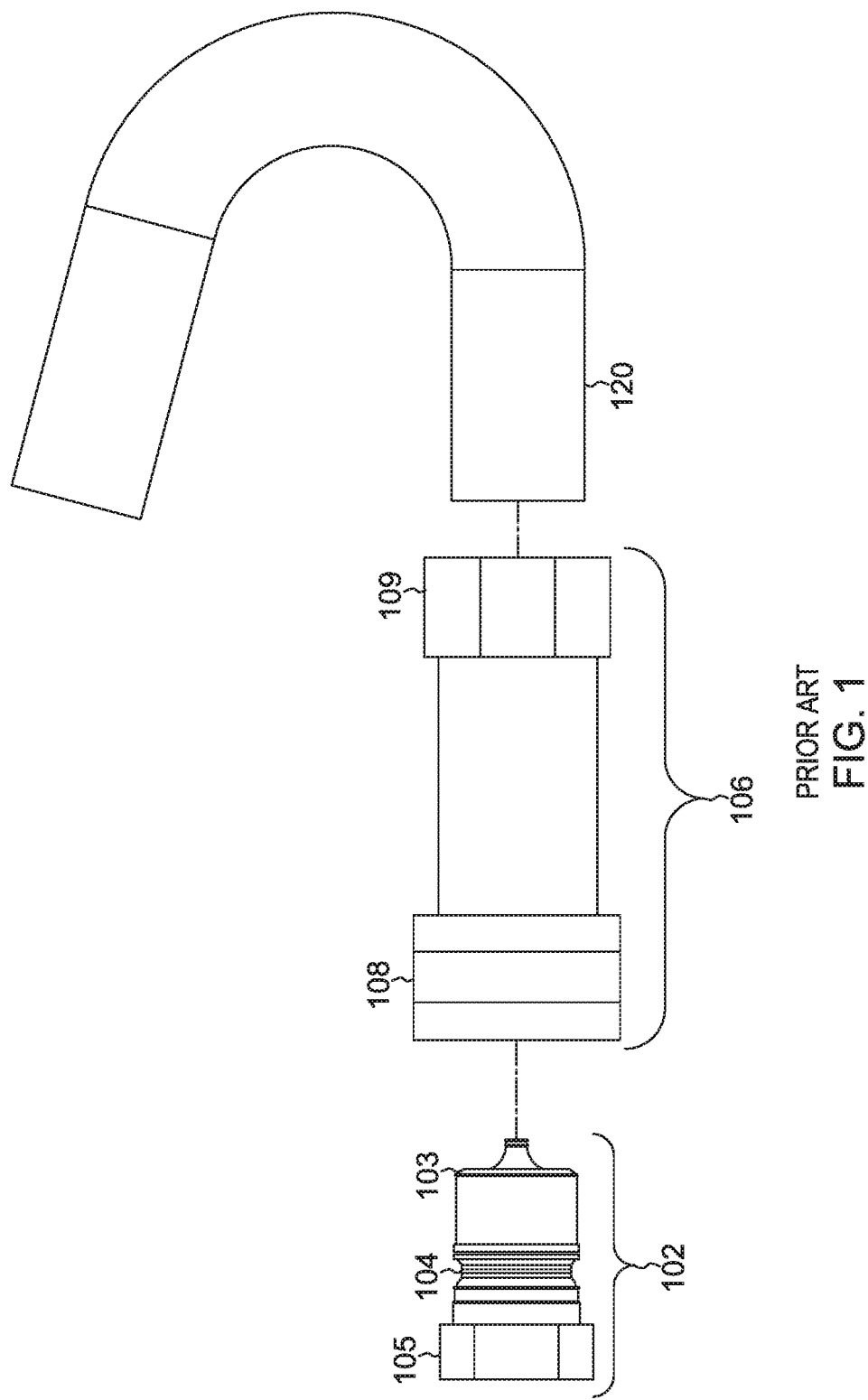
FIG. 1 is view of the prior art male and female quick connect couplers.

FIG. 1 is a view of the prior art male and female quick connect couplers. Generally, male quick connect 102 and female quick connect 106 are readily available in the industry. Both quick connects are generally formed of metal or plastic; however, many materials can be used to form the quick connects. In some embodiments, hose 120 is attached to one end of female quick connect 106. Further, another hose (not shown) that is similar to hose 120 can be attached to hose connection 105 of male quick connect 102. Hose 120 is readily available in the industry. In other embodiments, either female quick connect 106 or male quick connect 102 may be fixed directly to a device via hose connection 105 or hose connection 109.

Male quick connect 102 has nozzle 103 at one end and hose connection 105 at the other. Although not shown, a second hose (similar to hose 120) attaches to male quick connect 102 at hose connection 105, which is at the end of male quick connect 102 opposite nozzle 103. In some embodiments, male quick connect 102 has a series of ridges 104 between nozzle 103 and hose connection 105. Nozzle 103 is open at one end and is connected to ridges 104 at the second end. In the depicted embodiment, the opening of nozzle 103 is tapered. In various embodiments, nozzle 103 may be tapered more than or less than depicted. In some embodiments, nozzle 103 is not tapered, in which case the opening of nozzle 103 has an interior diameter at least equal to an interior diameter of the remainder of nozzle 103.

Ridges 104 are used to help lock male quick connect 102 into female quick connect 106. An external surface of some or all of male quick connect 102 is contoured to mate with an internal surface of some or all of female quick connect 106. For example, the exterior surface of male quick connect 102 includes an exterior surface of ridges 104 and nozzle 103. The external surface of male quick connect 102 is contoured such that male quick connect 102 tightly fits within female quick connect 106, minimizing fluid leakage when the quick connects are fitted together.

Female quick connect 106 has actuation collar 108 on one end and hose connection 109 at the other. Internally, female quick connect 106 has a protruded ring (not shown) that aligns with ridges 104 when male quick connect 102 is engaged with female quick connect 106. In one embodiment, the protruded ring includes one or more moveable structures (e.g., ball bearings) arranged in an annular pattern around an inner surface of female quick connect 106. In this case, the moveable structures are moveable along an axis that is perpendicular to the direction of flow of fluid through female quick connect 106. Actuation collar 108 is depicted in an at-rest position, in which position actuation collar 108 exerts a force on the protruded ring that causes the ring to protrude toward the center of female quick connect 106. In this position, the protruded ring has an inner diameter smaller than the outer diameter of nozzle 103. Actuation collar 108 is moveable between the at-rest position and a retracted position. In the retracted position, actuation collar 108 ceases to exert force on the protruded ring, which is then free to move away from the center of female quick connect 106. Actuation collar 108 is moved from the at-rest position to the retracted position by exertion of a force that moves actuation collar 108 toward hose 120. Actuation collar 108 is biased (e.g., by a spring force) toward returning to the at-rest position; therefore, if a force is not applied to actuation collar 108 in the direction of hose 120, then actuation collar 108 is in the at-rest position. In one embodiment, the movement of actuation collar 108 to the retracted position pulls up the protruded ring within female quick connect 106, allowing male quick connect 102 to be inserted into and removed from female quick connect 106.

For example, if actuation collar 108 is at rest while the quick connects are not engaged, male quick connect 102 cannot be inserted into female quick connect 106, as the protruded ring will obstruct the opening of female quick connect 106. Further, if actuation collar 108 is at rest while the quick connects are engaged, male quick connect 102 cannot be removed from female quick connect 106, as the protruded ring locks the quick connects together by engaging ridges 104, interfering with nozzle 103, or both. However, if actuation collar 108 is moved to the retracted position, then male quick connect 102 is able to freely engage and disengage from female quick connect 106.

Figure 2:
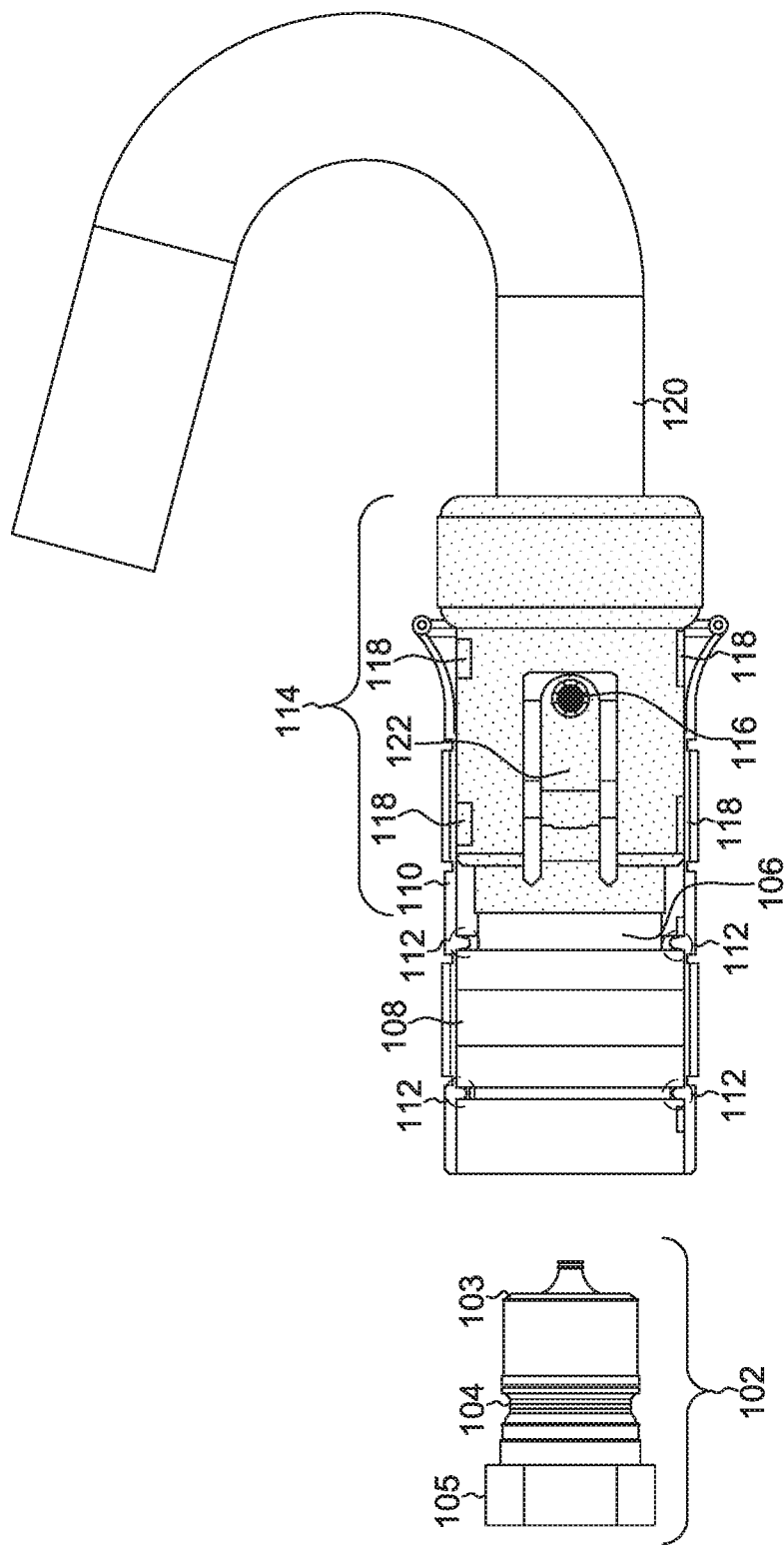
FIG. 2 is an illustration of a partial cutaway view of one embodiment of the present invention.

FIG. 2 is an illustration of a partial cutaway of one embodiment of the present invention. As depicted, FIG. 2 includes male quick connect 102, female quick connect 106, floating collar 110, fixed collar 114, and hose 120, wherein the floating collar 110 is depicted as a cutaway, to show the details of components generally covered by floating collar 110. Together, the components make up the quick connect apparatus assembly.

Floating collar 110 and fixed collar 114 are sleeves manufactured to fit around existing quick connect couplers. Therefore, the size and internal structure of both the floating collar 110 and fixed collar 114 vary to fit the size and shape of the quick connect couplers.

Fixed collar 114 is a sleeve that fits around female quick connect 106. Fixed collar 114 covers female quick connect 106 from hose connection 109 (FIG. 1) to the middle portion of female quick connect 106, such that actuation collar 108 can be moved to the retracted position without interference from fixed collar 114. In FIG. 2, fixed collar 114 partially obscures the view of female quick connect 106, which is more clearly depicted in FIG. 1. Generally, fixed collar 114 is formed of a hard plastic. However, other embodiments can include other materials, such as metals or a combination of materials.

The inner surface of fixed collar 114 corresponds to the outer surface of female quick connect 106. The inner surface of fixed collar 114 includes a plurality of flanges (not shown), perpendicularly disposed from the inner surface of fixed collar 114, which correspond to the contours of female quick connect 106. The flanges of fixed collar 114 are similar to flanges 112 of floating collar 110, as discussed below. The flanges of fixed collar 114 are formed of the same materials as fixed collar 114. The flanges are disposed on the inner surface of fixed collar 114 proximate each end of hose connection 109 of female quick connect 106. The flanges position fixed collar 114 relative to hose connection 109 of female quick connect 106. The flanges produce a complimentary inner surface of fixed collar 114 to the outer surface of female quick connect 106, which allows fixed collar 114 to fit close to female quick connect 106. The complimentary surfaces also allows fixed collar 114 to rotate freely around female quick connect 106 but inhibit fixed collar 114 from moving perpendicularly across female quick connect 106, e.g., toward or away from actuation collar 108. The free rotation will aid in the visibility of indicator 116, described below.

Flanges 112 are formed on the inner surface of floating collar 110, as shown, proximate each end of actuation collar 108. Flanges 112 are used by floating collar 110 to fit the contours of actuation collar 108 of female quick connect 106 and the outer surface of fixed collar 114. Flanges 112 inhibit floating collar 110 from sliding perpendicularly across female quick connect 106 unless actuation collar 108 is moved to the retracted position.

Fixed collar 114 is comprised of two complimentary pieces. For example, fixed collar 114 is comprised of a front piece and a back piece. The two pieces snap together using fasteners 118. In one embodiment, fasteners 118 are mated pairs of connectors that engage one another. Each mated pair includes a protrusion that mates with a perforation. The front piece and the back piece each include one connector of each mated pair. The mated pairs of fasteners 118 engage by positioning the front piece and back piece together such that the connectors of each mated pair align. In this embodiment, depicted in FIG. 2, the perforations are made along the length of the front piece on opposite sides of fixed collar 114. Further, complimentary protrusions are made along the length of the back piece. The front and back pieces snap together when protrusions of the back piece are fitted to complimentary perforations on the front piece. When the front and back pieces are joined together, fitted collar 114 takes on a substantially cylindrical hollow shape.

The front piece of fixed collar 114 includes push lever 122 and indicator 116. Push lever 122 works in conjunction with push button 124, shown in FIG. 3. Push lever 122 is positioned in the center of the front piece of fixed collar 114. In some embodiments, push lever 122 is rectangular in shape. In this embodiment, push lever 122 is perforated on three sides, such that when a downward force is applied to push lever 122 some or all of the perforated edges are depressed into the hollow form of fixed collar 114. Push lever 122 rests at an angle, such that when fixed collar 114 is formed around female quick connect 106, push lever 122 is biased away from female quick connect 106.

Indicator 116 is located on push lever 122 on the end furthest from the unperforated edge. Indicator 116 is raised and in some embodiments may be colored (e.g., red) to make it more visible.

Figure 3:
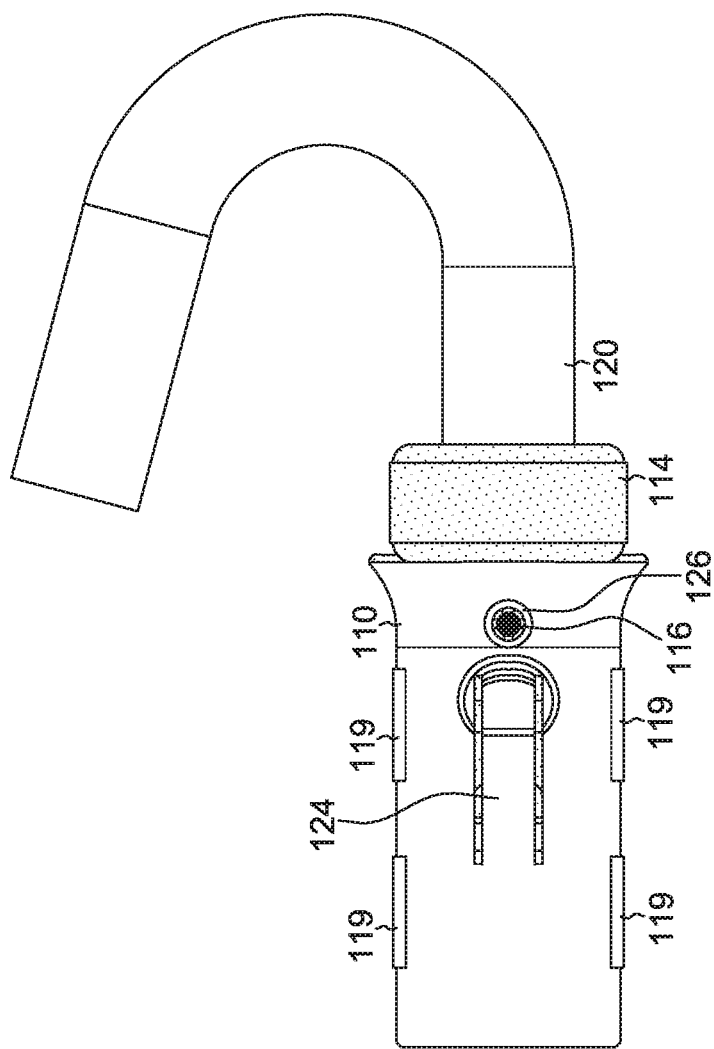
FIG. 3 is an illustration of one embodiment of the present invention in a locked position.
Figure 3:
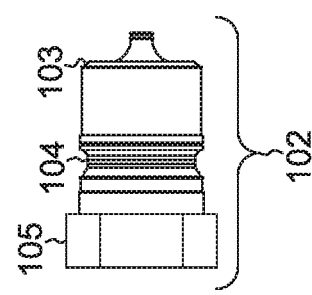

FIG. 3 is an illustration of one embodiment of the present invention in a locked position. FIG. 3 shows the quick connect apparatus assembly with the front piece of floating collar 110.

Similar to fixed collar 114, floating collar 110 is comprised of two pieces. For example, floating collar 110 is comprised of a front piece and a back piece. The two pieces snap together using fasteners 119. In one embodiment, fasteners 119 are mated pairs of connectors that engage one another. Each mated pair includes a protrusion that mates with a perforation. The front piece and the back piece each include one connector of each mated pair. The mated pairs of fasteners 119 engage by positioning the front piece and back piece together such that the connectors of each mated pair align. In the embodiment depicted in FIG. 3, the perforations are made along the length of the front piece on opposite sides of floating collar 110. Further, complimentary protrusions are made along the length of the back piece. The front and back pieces snap together when protrusions of the back piece are fitted to complimentary perforations on the front piece. When the front and back pieces are joined together, floating collar 110 takes on a substantially cylindrical hollow shape.

Floating collar 110 is a sleeve that fits around some or all of female quick connect 106 and fixed collar 114. The internal surface of floating collar 110 is complimentary to some or all of the outer surface of female quick connect 106 and fixed collar 114. The portion of floating collar 110 proximate to fixed collar 114 is frustoconical in shape, allowing floating collar 110 to partially slide over the portion of fixed collar 114 fitted to hose connection 109 of female quick connect 106. In some embodiments, floating collar 110 extends beyond actuation collar 108 to deflect the spray of fluid that leaks out of female quick connect 106.

The inner portion of floating collar 110 includes a plurality of flanges 112 on each side of actuation collar 108. Floating collar 110 moves toward fixed collar 114 in response to a force exerted on floating collar 110 when push button 124 is depressed, such that the indicator 116 on push lever 122 is disengaged. Flanges 112 translate the force exerted on floating collar 110 to actuation collar 108 such that the relative positions of floating collar 110 and actuation collar 108 are substantially maintained. Flanges 112 permit floating collar 110 to move toward fixed collar 114 only when actuation collar 108 moves toward fixed collar 114. In some embodiments, complimentary flanges are positioned on the outer surface of fixed collar 114 and the inner surface of floating collar 110. In this exemplary embodiment, the complimentary flanges cause floating collar 110 and fixed collar 114 to rotate simultaneously around female quick connect 106, but does not impede floating collar 110 from sliding along the length of female quick connect 106 when indicator 116 is disengaged.

The front piece of floating collar 110 includes push button 124 and viewing window 126. When the quick connect apparatus assembly is in the locked position, indicator 116 can be seen through viewing window 126. Further, indicator 116 lines up with and locks into viewing window 126 when floating collar 110 and actuation collar 108 are in the at-rest position, preventing floating collar 110 from sliding toward hose 120. When force is applied downward on push button 124 the force is transferred to push lever 122. The downward force on push lever 122 causes push lever 122, including indicator 116, to move inward, allowing floating collar 110 to slide toward hose 120. Thus, indicator 116 is visible through viewing window 126 when actuation collar 108 is in the at-rest position.

Push button 124 works in conjunction with push lever 122 to allow floating collar 110 to move toward hose 120. Push button 124 is positioned in the center of the front piece of floating collar 110. In some embodiments, push button 124 is rectangular in shape. In these embodiments, push button 124 is perforated on three sides—corresponding to the three perforated sides of push lever 122—such that when a force is applied to push button 124 some or all of the perforated edges are depressed into the hollow form of floating collar 110. As push lever 122 is located under push button 124, depressing push button 124 also depresses push lever 122. As push lever 122 is depressed, indicator 116 is unlocked from viewing window 126, allowing floating collar 110 to slide over indicator 116 of push lever 122 to a retracted position.

Figure 4:
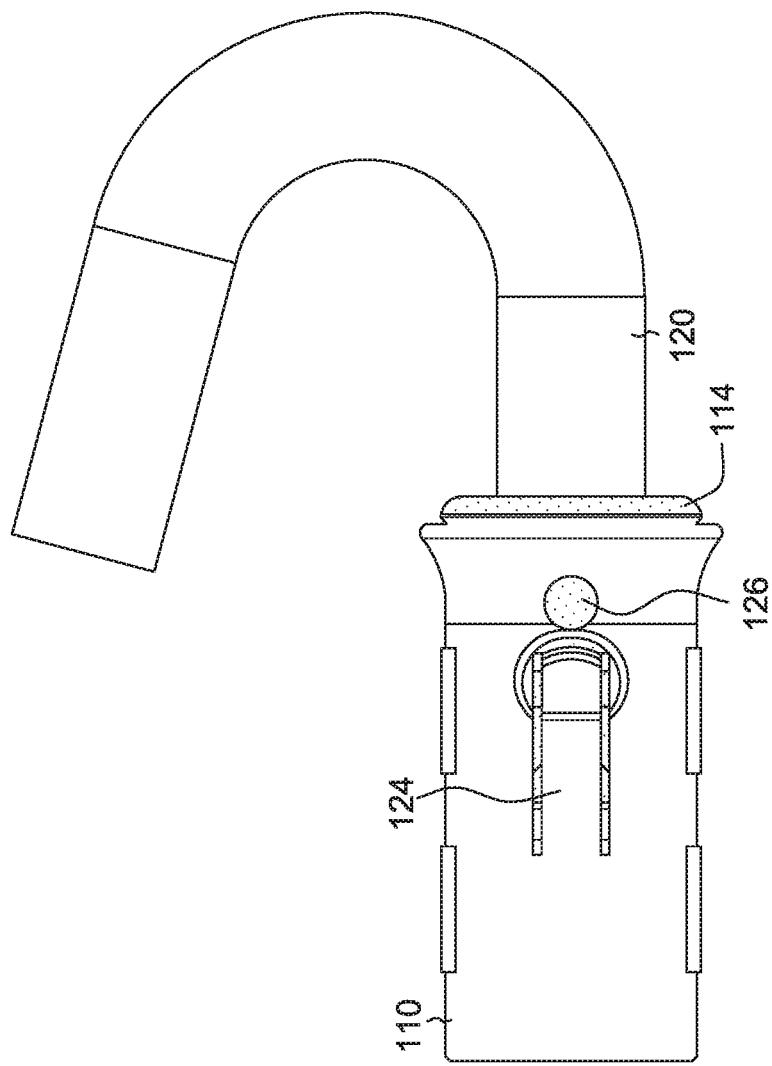
FIG. 4 is an illustration of one embodiment of the present invention in an unlocked position.
Figure 4:
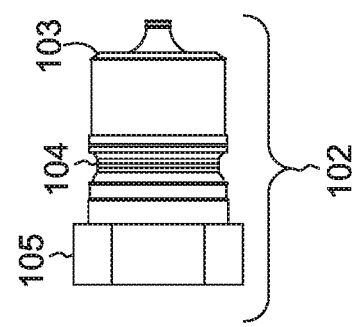

FIG. 4 is an illustration of one embodiment of the present invention in a retracted position. When the quick connect apparatus assembly is in the retracted position, indicator 116 is not visible through viewing window 126. The quick connect apparatus assembly in the unlocked position when floating collar 110 is slid back, toward hose 120, in preparation for mating the couplings.

As described, the quick connect apparatus assembly is unlocked by depressing push button 124 of floating collar 110. Flanges 112 move actuation collar 108 toward hose 120 when floating collar 110 is moved toward hose 120. Moving actuation collar 108 unlocks the quick connect assembly and allows male quick connect 102 to be inserted or removed from female quick connect 106. To lock the quick connect apparatus assembly after male quick connect 102 is inserted within female quick connect 106, floating collar 110 is moved away from hose 120 until indicator 116 can be seen through, and is locked into, viewing window 126.

Floating collar 110 and fixed collar 114 provide double security for the quick connect system. First, indicator 116 in viewing window 126 shows that female quick connect 106 is in the locked position. Without this indicator, a user may falsely believe the quick connect assembly is locked, which can result in liquid spills. Second, push lever 122 and push button 124 prevent female quick connect 106 from being inadvertently unlocked. Without fixed collar 114 and floating collar 110, actuation collar 108 can be inadvertently moved away from male quick connect 102, causing the quick connect assembly to disengage. For example, if the edge of actuation collar 108 gets caught in a computer assembly, actuation collar 108 can be moved to the retracted position by a force exerted on a hose attached to hose connection 105 that is directed away from actuation collar 108. In this example, floating collar 110 and fixed collar 114 protect the quick connect from inadvertently disengaging. In particular, disengaging the quick connect requires a simultaneous inward force on push button 124 and an force on floating collar 110 toward fixed collar 114. The multi-directional forces required reduce the chances of an accidentally unlocking or disengaging the quick connect.

What is claimed is:

1. A quick connect spray shield apparatus, the apparatus comprising:
   an inner sleeve having a first end, a second end, and a center axis that is parallel to an axis from the first end to the second end, wherein the inner sleeve has an inner surface that is contoured to position the inner sleeve relative to a female quick connect fitting;

an outer sleeve having a first end, a second end, and a center axis that is parallel to the center axis of the inner sleeve, wherein the outer sleeve has an inner surface contoured to position the outer sleeve relative to an actuating collar of the female quick connect fitting, wherein the actuating collar has an engaged position and a disengaged position;

wherein the inner sleeve is positioned distant from the actuating collar of the female quick connect fitting such that the actuating collar moves between the engaged position and the disengaged position without interference from the inner sleeve;

a plurality of flanges protruding from the inner surface of the outer sleeve, wherein the plurality of flanges translate a force exerted on the outer sleeve to the actuating collar, wherein the force is exerted in a direction parallel to the center axis of the outer sleeve;

an indicator disposed upon a lever located on the outer surface of the inner sleeve, wherein the lever is biased toward a locked position, and wherein the lever is moveable to an unlocked position by movement toward the center axis of the inner sleeve;

a viewing window disposed upon the outer sleeve that receives the indicator of the inner sleeve when the actuating collar is in the engaged position, wherein the indicator locks into the viewing window when the viewing window is received by the indicator, and wherein the outer sleeve is impeded from moving when the indicator is locked into the viewing window;

a flexible portion disposed on the outer sleeve that translates force to the lever of the inner sleeve, wherein the force is toward the center axis of the outer sleeve and wherein the flexible portion is aligned with the lever of the inner sleeve, and wherein the force on the lever unlocks the indicator from the viewing window;

wherein the outer sleeve is able to slide parallel to the center axis of the outer sleeve when the indicator is unlocked from the viewing window when the force is exerted in a direction parallel to the center axis of the outer sleeve; and wherein the first end of the outer sleeve receives a male quick connect fitting that mates with the female quick connect fitting, and wherein the female quick connect fitting transmits fluid in a direction parallel to the center axis of the inner sleeve and the center axis of the outer sleeve, and wherein the outer sleeve extends beyond the actuating collar, wherein the outer sleeve deflects the fluid upon a leak from the female quick connect fitting.

* * * * *